United States Patent [19]

Koenck et al.

[11] Patent Number: 5,394,306

[45] Date of Patent: Feb. 28, 1995

[54] SHOCK ABSORBENT PACKAGING APPARATUS

[75] Inventors: Steven E. Koenck; Darald R. Schultz, both of Cedar Rapids, Iowa

[73] Assignee: Norand Corporation, Cedar Rapids, Iowa

[21] Appl. No.: 116,886

[22] Filed: Sep. 7, 1993

[51] Int. Cl.⁶ .............................................. H02B 1/10
[52] U.S. Cl. .................................. 361/809; 174/52.1; 248/613; 361/736
[58] Field of Search .................... 369/263; 200/292; 248/560, 581, 605, 609, 613; 211/41; 439/76, 382; 174/52.1; 361/807, 809, 812, 724, 725, 736, 742, 600, 679

[56] References Cited

U.S. PATENT DOCUMENTS

| | | | |
|---|---|---|---|
| 4,409,641 | 10/1983 | Jakob | 361/386 |
| 4,713,714 | 12/1987 | Gatti | 360/137 |
| 5,029,026 | 7/1991 | Stefansky | 360/97.02 |
| 5,138,529 | 8/1992 | Colton | 361/424 |
| 5,221,811 | 6/1993 | Seldin | 174/52.1 |
| 5,253,147 | 10/1993 | Kleyner | 361/807 |
| 5,289,348 | 2/1994 | Miller | 361/809 |

*Primary Examiner*—Gerald P. Tolin
*Attorney, Agent, or Firm*—Suiter & Associates

[57] ABSTRACT

The present invention provides a mechanism for kinetic energy dissipation which allows the bulk of the mass (e.g., a portable terminal) to be decelerated over some working distance such that the deceleration force is below the damage point. The present invention provides a molded "rubberlike" structure that serves as a carrier or cushion for internal structure (e.g., internal components of a portable terminal). The carrier structure has molded features including an outer frame that serves as a gasket, bumper and support and an inner structure which is molded to conform to the shape of the fragile electronic components that make up, for example, the terminal.

1 Claim, 2 Drawing Sheets

SHOCK ABSORBENT PACKAGING APPARATUS

TECHNICAL FIELD

The present invention relates to shock absorbent mounts and more particularly to a method and apparatus for shock mounting electronic components within a housing.

BACKGROUND ART

An important long term reliability and survivability objective of portable terminal products is the ability to survive potentially damaging impact such as might be sustained by drops of the terminal to unyielding surfaces such as concrete. As the portable terminal industry has matured and developed, the expectations and requirements of terminal designs have steadily increased to the point that new terminals must be specified to survive repeated drops from distances as high as six feet to concrete.

The trend toward smaller size in portable terminals is causing increasing pressure to remove elements of the design that contribute to size and bulk of the products. Portable terminals are often used and held in the hand of an operator for exceptionally long operating periods leading to fatigue and an increased likelihood that the unit will be dropped. Hand straps have generally been included as part of the portable terminal design to reduce the potential for drop and subsequent damage to the terminal. Unfortunately, these hand straps are often bulky and subject to wear and damage, leading to yet another service liability.

There are two accepted impact survivability philosophies: either (1) prevent the impact or (2) survive it. Obviously, it is impossible to completely eliminate all occurances of impact, and further, if the terminal must be specified to survive severe drops of, for example, six feet, then there is little reason to invest complexity in drop prevention. Ultimately, the best solution is to tolerate and survive the impacts that the terminal may sustain.

It is an object of the present invention to significantly improve the impact survivability of portable electronic equipment such as hand held data terminals. It is a further object of the invention to simplify and improve the efficiency and quality of the processes required to manufacture the equipment.

DISCLOSURE OF THE INVENTION

The present invention provides a mechanism for kinetic energy dissipation which allows the bulk of the mass (e.g., a portable terminal) to be decelerated over some working distance such that the deceleration force is below the damage point. The present invention provides a molded "rubberlike" structure that serves as a carrier or cushion for internal structure (e.g., infernal components of a portable terminal). The carrier structure has molded features including an outer frame that serves as a gasket, bumper and support and an inner structure which is molded to conform to the shape of the fragile electronic components that make up, for example, the terminal.

BEST MODE FOR CARRYING OUT THE INVENTION

The physics of impact tolerance involves the dissipation of energy that is imparted to the object in the impact event. Consider an object elevated to a height in the presence of gravity. By raising the object to such a height, potential energy is imparted to the object according to the formula:

$$PE = mgy$$

where m=mass of the object, g=accelaration of gravity, and y=height of the object.

If the object is dropped from that height, the potential energy is converted to kinetic energy under the principle of conservation of energy and is given by the formula:

$$KE = \tfrac{1}{2}mv^2$$

where m=mass of the object, and v=velocity of the object.

Once the object is dropped and gains velocity, its kinetic energy must be dissipated to bring the object to rest. The kinetic energy may be dissipated either by bouncing, whereby the energy is stored in the resilience of the object and released in the form of velocity in another direction, or by absorption where a deceleration force acting over a distance reduces the velocity of the mass.

The major liability of bouncing or elastic energy storage as a means of dissipating kinetic energy is that it requires materials such as case housings and the like to be extremely resilient and have high tensile strength. This is problematic since a preferred material for fabrication of case housings for portable terminals is injection molded thermoplastic, which generally doesn't have high tensile strength, especially at elevated temperatures.

A preferred mechanism for kinetic energy dissipation is to allow the bulk of the mass of the portable terminal to be decelerated over some working distance such that the deceleration force is below the damage point of the component. The present invention provides a molded "rubberlike" structure that serves as a carrier or cushion for the member to be shielded (for example the internal components of a portable terminal). The carrier structure has molded features including an outer frame that serves as a gasket, bumper and support, and an inner structure which is molded to conform to the shape of the fragile electronic components that make up, for example, the terminal. A 2-dimensional example of a shock absorbing structure is as shown in FIG. 3.

Figure 3:
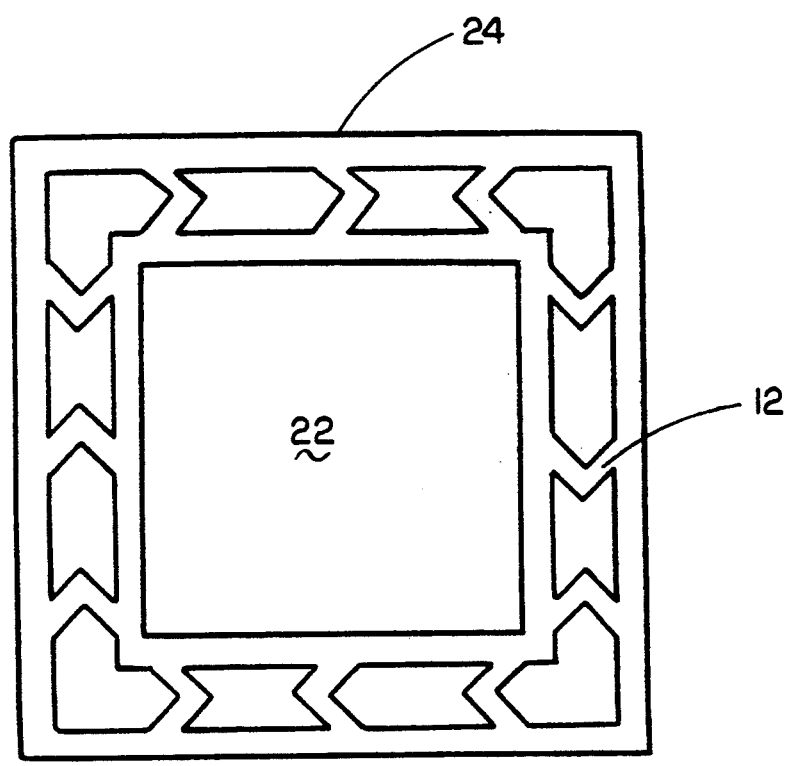
FIG. 3 is a cross-sectional diagram of an exemplary structure for shielding an internal structure from shock.

The structure as shown in FIG. 3 includes an outer portion, an inner portion, and shock absorbing elements that are molded of the same material as the outer and inner portions. There are two reasons why shock absorbing elements are used as the spacer and support for the inner portion rather than just molding the shape of solid material. First, by using the more hollow configuration, less material and hence less weight is required. Second, by forming shock absorbing elements to space and support the inner portion from the outer portion, better control of the shock deceleration movement may be obtained, and tougher, higher density material may be used. This is especially valuable if the outer portion of the structure is intended to serve as an exterior gasket and bumper that must have toughness and resilience at the same time. Solid material that would yield enough to protect the inner portion would not be tough enough to survive external exposure and abrasion.

The shock absorbing structures may be formed in a variety of shapes that allow controlled movement as deformation increases under an impact event. The shapes shown in FIG. 3 demonstrate the concept, however, there may be shapes that cause progressively less deformation as impact forces increase, in other words, to require proportionally greater force to increase deformation. This characteristic would prevent the inner structure from "bottoming out" under the extreme impact events. In all cases, the inner structure moves under impact conditions, which allows tailoring and control of the "g" forces sustained by the components contained with that structure.

FIGS. 2A through 2F illustrate exemplary deformations which may result from the movement of the inner structure with respect to the outer structure. It should be understood that the examples shown are illustrated as 2-dimensional structures for ease of illustration. In the case of 3-dimensional structures, however, molding techniques must be taken into consideration so that removal of the part from the mold may be accomplished. It is preferred that complex 3-dimensional impact tolerant systems be constructed in multiple 2-dimensional tolerant sections.

Figure 1:
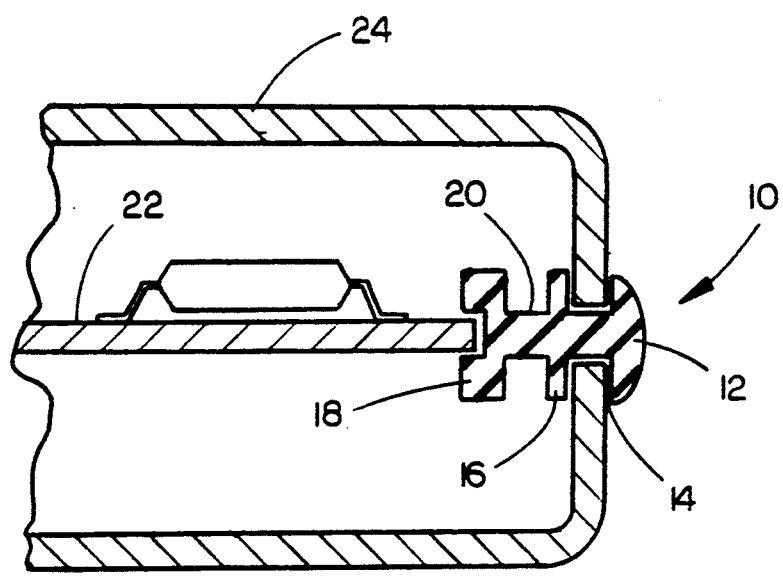
FIG. 1 is a cross-sectional view of a preferred utilization of a shock mount apparatus of the present invention.
Figure 2A:
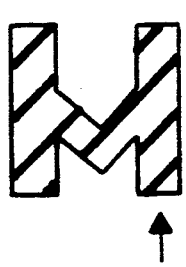
FIGS. 2A through 2F are cross-sectional diagrammatic views illustrating shock impact effects.
Figure 2B:
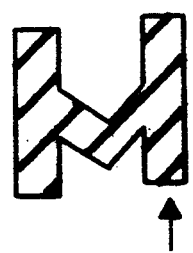
Figure 2C:
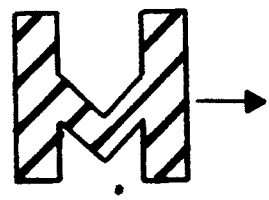
Figure 2D:
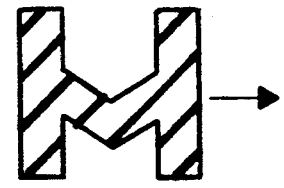
Figure 2E:
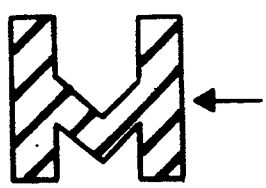
Figure 2F:
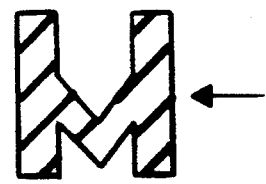

FIG. 1 is an exemplary cross-sectional view of a preferred shock mount support structure 10 which provides gasket (14, 16) bumper 12 component carries 18 assembly support 20. FIG. 3 illustrates several aspects of the invention:

1. The constraint system serves as a seal or gasket when compressed between rigid case components;
2. The exposed portion of the constraint system may serve as a cushion or bumper that may dissipate some of the impact energy in the event of a direct impact;
3. The contained components allow the infernal component(s) to move freely within the constraint system;
4. Increased interior space is required for this or any other method that seeks to decelerate components over a distance (the deceleration distance);
5. For the working impact deceleration distance to be reduced, the stiffness of the constraint system must be increased, which increases the deceleration force sustained by the contained components; and
6. The maximum survivable component deceleration force and maximum terminal drop distance will determine the minimum deceleration distance required to safely sustain the worst case impact event.

The shock mount carrier system essentially constitutes a spring that may be compressed by the deceleration of the protected components such that the kinetic energy of the terminal is converted info elastic potential energy in the spring structure. By conservation of energy, the initial gravitational potential energy is converted to kinetic energy which is then converted to elastic potential energy. The equations governing this energy-to-energy conversion are:

$PE = mgy$ (gravitational potential energy)
$KE = \frac{1}{2}mv^2$ (kinetic energy)
$PE = \frac{1}{2}kx^2$ (elastic potential energy)
or
$mgy = \frac{1}{2}kx^2$
and
$f = -kx = ma$ (where $a$ = displacement deceleration) thus,
$a = -kx/m$
$k = am/x$
$mgy = \frac{1}{2}(am/x)x^2$
$y = \frac{1}{2}(a/g)x$ where $y$ = drop height, $x$ = impact displacement distance, $g$ = acceleration of gravity, and $a$ = deceleration force in g's.

As an example, consider 0.25 kg mass dropped from a height of 2 m with a specified maximum impact shock of 400 g's. Using the formulas:

$$\begin{aligned} x &= 2gy/a \\ &= 2*(9.75 \text{ m/s}^2)*(2 \text{ m})/(400 \text{ g}) \\ &= 1 \text{ cm} \end{aligned}$$

$$\begin{aligned} k &= am/x \\ &= 400*(9.75 \text{ m/s}^2)*(0.25 \text{ kg}/0.01 \text{ m}) \\ &= 97,500 \text{ N/m} \end{aligned}$$

While the invention has been described with a certain degree of particularity, it is manifest that many changes may be made in the details and arrangement of components without departing from the spirit and scope of the disclosure. It is understood that the invention is not limited to the embodiments set forth herein for purposes of exemplification, but is limited only by the scope of the appended claims including the full range of equivalency to which each element thereof is entitled. Thus, there has been shown and described a shock absorbent packaging method and apparatus.

We claim:

1. A shock absorbent package, comprising:
   (a) a shock sensitive component;
   (b) a protective housing with a wall having exterior and interior sides, said housing having
      (1) an interior space protectively housing said shock sensitive component, and
      (2) at least two openings providing accesses to said shock sensitive component; and
   (c) at least two shock absorbent mounts, each extending through one of said openings and protectively mounting said shock sensitive component within said interior space of said protective housing, said mounts each having
      (1) a bumper portion extending outside said protective housing and fabricated from an elastically deformable polymer for dissipating shock energy to said housing,
      (2) an outer seal and an inner seal, said outer seal abutting against the exterior of the wall of said protective housing and said inner seal abutting against the interior of the wall of said protective housing, said seals fabricated from an elastically deformable polymer and elastically deformably connected to said bumper portion for sealing said interior space of said housing,
      (3) a mounting portion fabricated from an elastically deformable polymer and elastically deformably connected to said outer and inner seals and said bumper portion for securing said mount to said shock sensitive component, and (4) an elastically deformable portion between said bumper portion and said mounting portion for dissipating shock energy to said shock sensitive component.

* * * * *